United States Patent
Machino

(10) Patent No.: US 8,400,215 B2
(45) Date of Patent: Mar. 19, 2013

(54) POWER AMPLIFICATION DEVICE FOR SATELLITE COMMUNICATION DEVICE

(75) Inventor: Yoshiatsu Machino, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 79 days.

(21) Appl. No.: 12/922,800

(22) PCT Filed: Mar. 25, 2009

(86) PCT No.: PCT/JP2009/055950
§ 371 (c)(1),
(2), (4) Date: Sep. 15, 2010

(87) PCT Pub. No.: WO2009/119665
PCT Pub. Date: Oct. 1, 2009

(65) Prior Publication Data
US 2011/0012675 A1    Jan. 20, 2011

(30) Foreign Application Priority Data

Mar. 27, 2008    (JP) .................................. 2008-083830

(51) Int. Cl.
*H03F 3/68* (2006.01)
(52) U.S. Cl. .................................... 330/124 R; 330/295
(58) Field of Classification Search .............. 330/124 R, 330/295, 84, 126
See application file for complete search history.

(56) References Cited

U.S. PATENT DOCUMENTS

| | | | |
|---|---|---|---|
| 4,439,740 A * | 3/1984 | Harrington | 330/124 R |
| 4,644,301 A | 2/1987 | Hecht | |
| 6,020,796 A | 2/2000 | Collar et al. | |
| 6,070,063 A * | 5/2000 | Yoshizawa et al. | 455/234.1 |
| 6,093,981 A * | 7/2000 | Cali' et al. | 307/113 |
| 6,094,097 A * | 7/2000 | Ke | 330/124 R |
| 6,657,487 B2 * | 12/2003 | Lauffenburger et al. | 330/9 |
| 7,498,878 B2 * | 3/2009 | Lim | 330/124 R |
| 7,514,995 B2 * | 4/2009 | Yuan | 330/124 R |
| 2005/0110564 A1 | 5/2005 | Lane et al. | |

FOREIGN PATENT DOCUMENTS

| | | |
|---|---|---|
| DE | 42 03 176 A1 | 8/1993 |
| DE | 43 17 856 A1 | 12/1994 |
| DE | 43 33 515 A1 | 4/1995 |
| EP | 0 520 203 A1 | 5/1992 |
| JP | 1 103306 | 4/1989 |
| JP | 4 332209 | 11/1992 |
| JP | 5 55802 | 3/1993 |

OTHER PUBLICATIONS

European Search Report issued Jan. 17, 2012 in Application No. 09725282.

* cited by examiner

*Primary Examiner* — Henry Choe
(74) *Attorney, Agent, or Firm* — Oblon, Spivak, McClelland, Maier & Neustadt, L.L.P.

(57) ABSTRACT

A power amplification device for a satellite communication device with a redundant configuration, in which a plurality of power amplifiers including a standby power amplifier are connected in a ring shape, and which easily switches connection to the standby power amplifier in a case of a failure in active power amplifiers without closing a detour route. The power amplification device for the satellite communication device includes a plurality of basic units each including: a plurality of power amplifiers including at least one standby power amplifier, which are arranged in parallel; a plurality of switches provided to input ends and output ends of the plurality of power amplifiers for switching connection paths; and bypass connection lines for connecting the plurality of switches in a ring shape, and the plurality of basic units are connected in cascade.

16 Claims, 11 Drawing Sheets

FIG. 5

| HPA Channel | 1st Redundant | Home Position |
|---|---|---|
| 1 | 1R | 1R |
| 2 | 1R | 4R |
| 3 | 1R | 2R |
| 4 | 1R | 3R |
| 5 | 2R | 2R |
| 6 | 2R | 1R |
| 7 | 2R | 3R |
| 8 | 2R | 4R |
| 9 | 3R | 3R |
| 10 | 3R | 2R |
| 11 | 3R | 4R |
| 12 | 3R | 1R |
| 13 | 4R | 4R |
| 14 | 4R | 3R |
| 15 | 4R | 1R |
| 16 | 4R | 2R |

| HPA Channel | 1st Redundant | Home Position |
|---|---|---|
| 1 | 1R | 1R |
| 2 | 1R | 5R |
| 3 | 1R | 2R |
| 4 | 1R | 3R |
| 5 | 2R | 2R |
| 6 | 2R | 1R |
| 7 | 2R | 3R |
| 8 | 2R | 4R |
| 9 | 3R | 3R |
| 10 | 3R | 2R |
| 11 | 3R | 4R |
| 12 | 3R | 5R |
| 13 | 4R | 4R |
| 14 | 4R | 3R |
| 15 | 4R | 5R |
| 16 | 4R | 1R |
| 17 | 5R | 5R |
| 18 | 5R | 4R |
| 19 | 5R | 1R |
| 20 | 5R | 2R |

POWER AMPLIFICATION DEVICE FOR SATELLITE COMMUNICATION DEVICE

TECHNICAL FIELD

The present invention relates to a power amplification device for a satellite communication device with a redundant configuration capable of switching an amplifier to a standby amplifier.

BACKGROUND ART

There is disclosed, as a satellite communication device mounted on an artificial satellite, a communication relay including a power amplification device in which a plurality of power amplifiers (high power amplifiers) with a redundant configuration are connected to a changeover switch group, and in a case of a failure in an active power amplifier, a changeover is made to a standby power amplifier for operation (see, for example, Patent Document 1). By providing the redundant configuration, in the case of the failure in the amplifier of the satellite relay during the satellite operation, a satellite communication channel service may be prevented from shutting down by making the changeover to the standby amplifier.

Patent Document 1: JP 06-296115 A

DISCLOSURE OF THE INVENTION

Problem to be Solved by the Invention

A conventional mainstream redundant configuration of a power amplification device for a satellite communication device provides two changeover routes to a standby device, one on the upper side and one on the lower side of the faulty equipment. This enables the changeover to the standby device for failures in up to two power amplifiers without blocking the other power amplifiers. In the case of this configuration, however, the changeover to the standby device is disabled when a third failure occurs due to the complication of the detour route.

It should be noted that equipment accommodating multiple channels mostly adopts a redundancy ratio of 4:3 or 5:4, but the number of the standby devices increases as the number of the power amplifiers increases. Therefore, the overall number of the standby devices may be decreased by connecting all the power amplifiers in a ring shape. In this case, however, depending on the way the connection is made, when the failures in the power amplifiers concentrate locally, the detour route for the previous faulty power amplifier may block the detour route for the next faulty power amplifier to close the detour route. In order to prevent this closure, it is necessary to provide an adequate detour route for appropriate connection to the dispersedly located standby devices.

The present invention has been made in order to solve the above-mentioned problem, and an object of the present invention is therefore to provide a power amplification device for a satellite communication device with a redundant configuration, which connects in the ring shape a group of changeover switches for switching connection on each of an input side and an output side of a plurality of amplifiers including a standby device, and which easily switches the connection to the standby device without closing the detour route in the case of the failure in the active power amplifier.

Means for Solving the Problem

The present invention provides a power amplification device for a satellite communication device, including a plurality of basic units each including: a plurality of power amplifiers including at least one standby power amplifier, which are arranged in parallel; a plurality of switches provided to input ends and output ends of the plurality of power amplifiers for switching connection paths; and a bypass connection line for connecting the plurality of switches in a ring shape, in which the plurality of basic units are connected in cascade.

Effects of the Invention

According to the present invention, the plurality of basic units in which the switches are connected in the ring configuration are connected in cascade so that the number of the detour routes increases in proportion to the number of stages, to thereby prevent the closure of the detour routes even in the case of failures in consecutive power amplifiers.

BRIEF DESCRIPTION OF THE DRAWINGS

FIG. 5 A diagram illustrating standby power amplifiers to be switched to when the failures occur in the power amplifiers of the even-stage connection configuration of FIG. 3.

FIG. 8 A diagram illustrating standby power amplifiers to be switched to when failures occur in the power amplifiers of the odd-stage connection configuration of FIG. 7.

BEST MODE FOR CARRYING OUT THE INVENTION

First Embodiment

Figure 1:
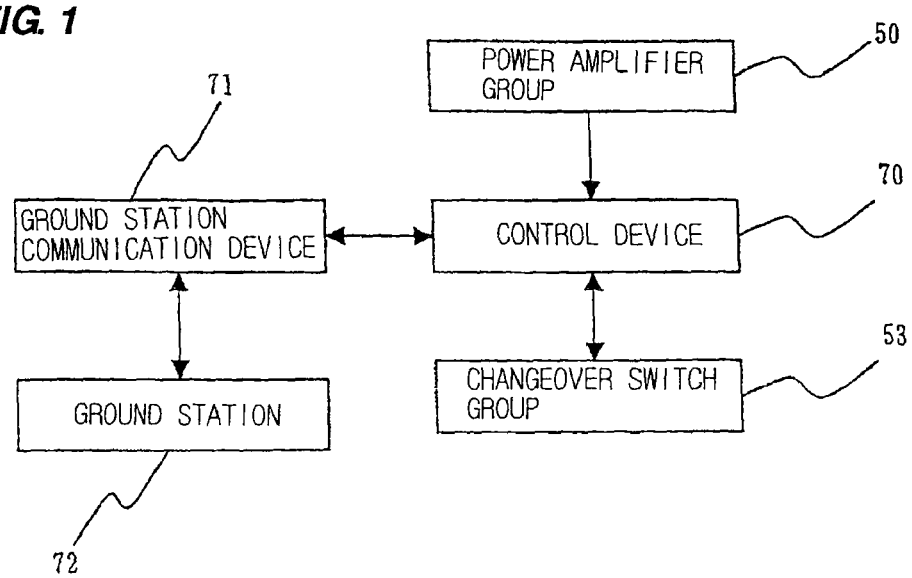
FIG. 1 A diagram illustrating a configuration of a satellite communication device including a power amplification device for the satellite communication device according to a first embodiment of the present invention.
Figure 2:
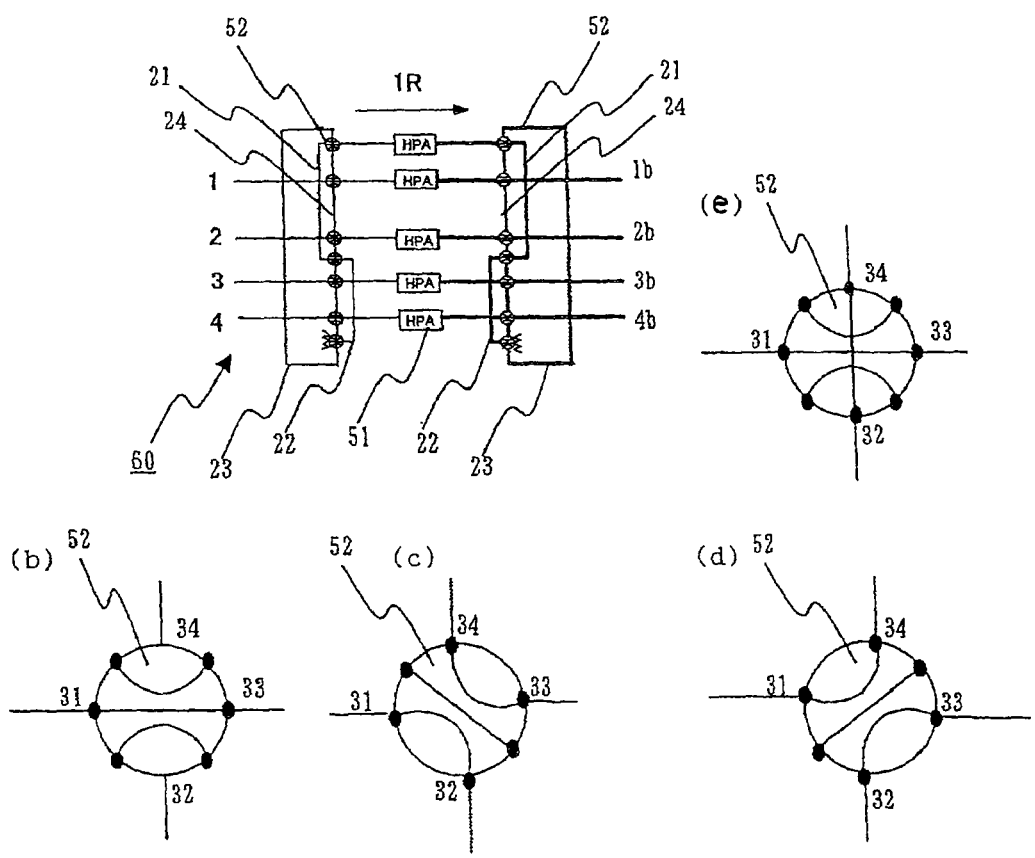
FIG. 2 Diagrams illustrating an example of a basic unit of the power amplification device according to the first embodiment of the present invention, in which five power amplifiers including one standby power amplifier constitute one group.
Figure 3:
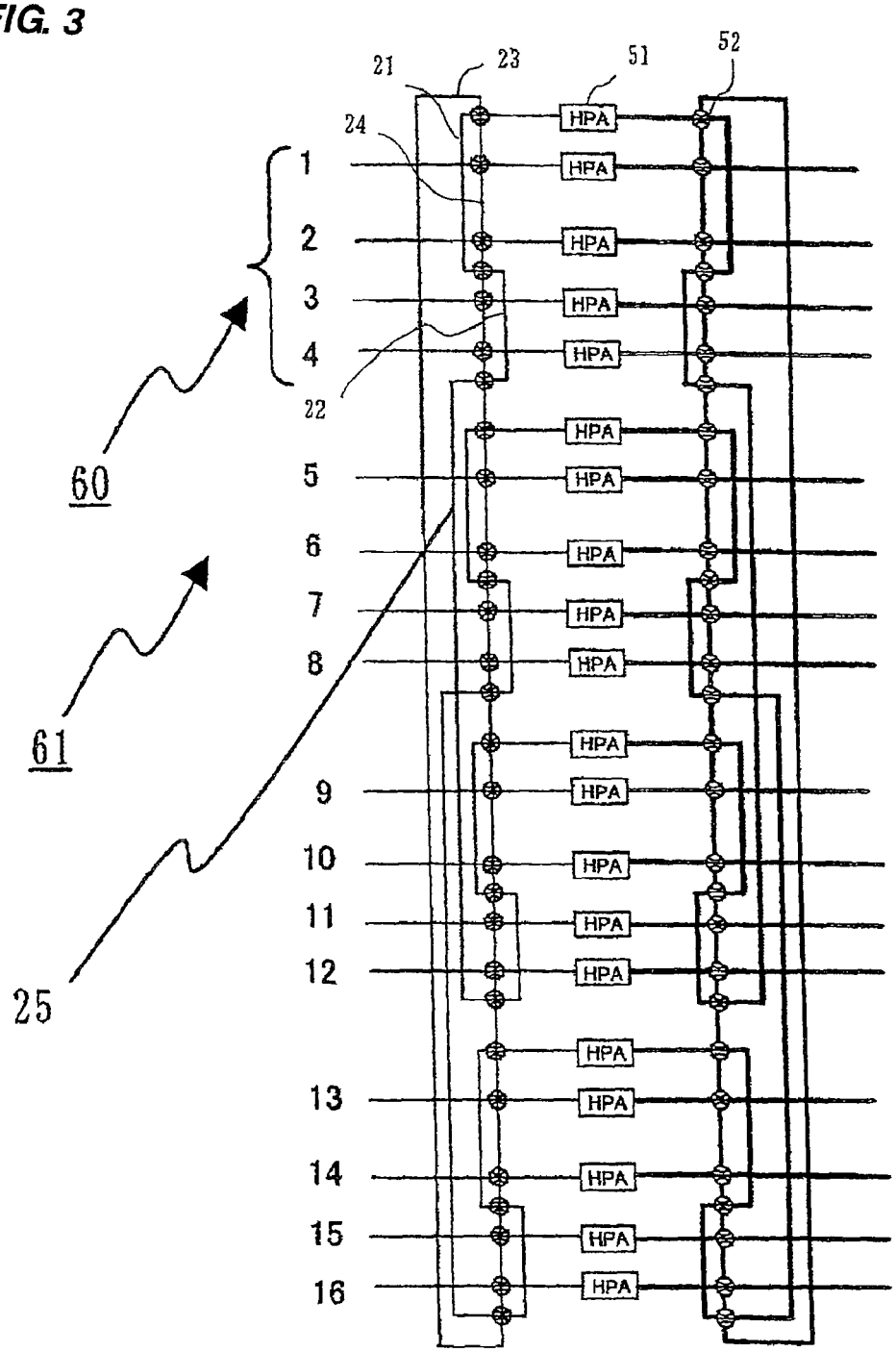
FIG. 3 A diagram illustrating an even-stage connection configuration according to the first embodiment of the present invention, in which an even number of the basic units illustrated in FIG. 2 are connected in cascade.

FIG. 1 is a diagram illustrating a configuration of a satellite communication device including a power amplification device for the satellite communication device according to a first embodiment of the present invention. FIG. 2 are diagrams illustrating an example of a basic unit of the power amplification device, in which five power amplifiers including one standby power amplifier constitute one group, and FIG. 3 is a diagram illustrating an example of an even-stage connection configuration of the power amplification device for the satellite communication device according to the present invention, in which a plurality of the basic units illustrated in FIG. 2 are connected in cascade. In the figures, identical or corresponding portions are represented by identical reference numerals and symbols (the same applies hereinafter).

The satellite communication device includes a ground station communication device 71 for communication with a ground station 72, a control device 70 that receives a command from the ground station 72 via the ground station communication device 71, a power amplifier group 50 consisting of a plurality of power amplifiers (hereinafter, referred to as high power amplifiers (HPAs)) 51 (see FIG. 2), and a changeover switch group 53 for connection paths consisting of a plurality of switches 52 (see FIG. 2). The control device 70 monitors operation states (for example, drain voltage and source voltage) of the HPAs 51 constituting the power amplifier group 50 and connection states of the switches 52 to detect the presence or absence of a failure in the HPAs 51. When a failure is detected in the HPAs 51, the control device 70 operates the switches 52 constituting the changeover switch group 53 based on the command received from the ground station 72 and the detected states of the HPAs and switches to switch the connection paths among the switches 52 and the HPAs 51 to establish desired connection. The switches 52 are arranged on each of an input side and an output side of the HPAs 51, and the switches 52 are connected to a ring-shaped bypass connection line. The operation states of the HPAs 51 and the connection states of the switches 52, which are detected by the control device 70, are also transmitted to the ground station 72 via the ground station communication device 71 by a telemetry system, and the ground station 72 constantly monitors the operation states of the HPAs 51 and the connection states of the switches 52. Note that, subsequent operations are not performed when there is no failure.

Now, the connection configuration of the HPAs 51 and the switches 52 is described.

First, a redundant configuration that supports failures in four HPAs in the ring is described.

The even-stage connection configuration illustrated in FIG. 3 includes a redundant system including a power amplifier serving as a standby device (standby HPA). Input ends and output ends of the HPAs 51 are respectively connected in ring shapes to form a plurality of channels, and hence a channel may be maintained for failures in any four HPAs in the ring (including failures in four consecutive HPAs). Further, in the configuration, a failure in the first HPA does not block other operating channels.

[Basic Unit 60 Having a Group of Five HPAs]

First, a configuration example of a basic unit 60 in which five HPAs 51 constitute one group is described. FIG. 2 are diagrams illustrating an example of the basic unit of the power amplification device in which five HPAs including one standby HPA constitute one group, of which FIG. 2(a) is a diagram illustrating one basic unit, FIGS. 2(b) to 2(d) are diagrams illustrating connection forms of the switch 52, and FIG. 2(e) is a diagram illustrating a modification example of the switch 52 on the input end side. Note that, FIGS. 2(b) and 2(e) illustrate states at the same rotational position, FIG. 2(c) illustrates a state obtained by rotating 45 degrees clockwise from the state of FIG. 2(b), and FIG. 2(d) illustrates a state obtained by rotating 45 degrees counterclockwise from the state of FIG. 2(b).

Each of the switches 52 includes, as illustrated in FIG. 2(b) for example, a circular rotating part for connection between ports 31 to 34 provided on the circumference every 90 degrees of the rotational angle. The rotating part includes a first conductive member of, for example, a linear shape having connection ends on both sides at diagonal positions of the rotating part (connecting the ports 31 and 33 in FIG. 2(b)), and a second conductive member and a third conductive member of, for example, a U shape having connection ends at positions 45 degrees in rotational angle away from the connection ends on both sides of the first conductive member, and provided symmetrically on both sides of a line along the first conductive member. Note that, for the switches on the input side, as illustrated in FIG. 2(e), the rotating part may further include a fourth conductive member of, for example, a linear shape which is orthogonal to the first conductive member and electrically isolated from the other conductive members.

In the following description, the position of the switch and the HPA is designated by the number of stages counted from the top of the illustrated device.

In FIG. 2(a), the numbers 1 to 4 on the left indicate numbers of active channels input to the basic unit 60, the numbers 1b to 4b on the right indicate numbers of active channels output from the basic unit 60, and 1R represents a standby HPA connected to no channel.

The active channels 1 to 4 and the active channels 1b to 4b are generally connected to input ends and output ends of the HPAs 51 via the switches 52, respectively. At this time, as illustrated in FIG. 2(b), each of the switches 52 takes a connection form in which the input end and the output end are oriented horizontally to the drawing sheet, and the input ends and the output ends of the HPAs 51 are connected to the corresponding active channels 1 to 4 and 1b to 4b via the ports 31 and 33.

There are also provided a bypass connection line 21 which connects the left port 31 of the first-stage switch from the top of FIG. 2(a) to the left port 31 of the fourth-stage switch from the top, and a bypass connection line 22 which connects the right port 33 of the fourth-stage switch from the top to the right port 33 of the seventh-stage switch from the top.

There is also provided a bypass connection line 23 which connects the upper port 34 of the first-stage switch from the top (top stage) of FIG. 2(a) to the lower port 32 of the seventh-stage switch from the top (bottom stage).

There is also provided a bypass connection line 24 which vertically connects every two of the first-stage to seventh-stage switches from the top of FIG. 2(*a*) (connects adjacent ports 32 and 34).

The connection lines 21 to 24 form a ring-shaped detour route, and the connection lines are configured to be symmetrical with respect to the HPAs on the input side and the output side of the HPAs.

Stated simply, the basic unit 60 of the power amplification device includes the bypass connection line 24 which vertically connects the adjacent switches, the bypass connection lines 21 and 22 forming inner loops which connect every second or third separate switches (standby HPA connecting switches) in a U shape or an S shape, and the bypass connection line 23 forming an outer loop which connects the top and bottom switches (standby HPA connecting switches) outside the bypass connection lines 21 and 22 in a U shape. There are also provided switches corresponding to active HPAs on input and output sides thereof (active HPA connecting switches), as well as switches (standby HPA connecting switches) including the one between the third-stage and fourth-stage active HPAs and the one below the bottom-stage active HPA, for each of the input side and the output side.

Note that, the left port 31 of the switch 52 on the input side and the right port 33 of the switch 52 on the output side that are provided in the seventh stage from the top (bottom portion) are connected to dummy terminals for convenience of description.

The basic unit has a configuration in which, in a case of a failure in any one of the HPAs of the channels 1 to 4, the connection is made to the standby HPA in the same group without affecting the other operating channels, to thereby satisfy a redundant connectivity (1st redundancy) in the case of the failure in the first stage.

For example, in a case of a failure in the second-stage HPA from the top connected to the active channel 1, the first-stage and second-stage switches 52 from the top on the input end side take the connection form of FIG. 2(*d*), and the active channel 1 is connected to the connection line 24 by the second-stage switch 52 from the top in which the port 31 and the port 34 are connected. The connection line 24 is further connected to the input end of the standby HPA 1R by the first-stage switch 52 from the top in which the port 32 and the port 33 are connected. Therefore, the active channel 1 is connected to the input end of the standby HPA 1R.

Similarly, the first-stage and second-stage switches 52 from the top on the output end side take the connection form of FIG. 2(*c*), and the active channel 1*b* is connected to the connection line 24 by the second-stage switch 52 from the top in which the port 34 and the port 33 are connected. The connection line 24 is further connected to the output end of the standby HPA 1R by the first-stage switch 52 from the top in which the port 31 and the port 32 are connected. Therefore, the active channel 1*b* is connected to the output end of the standby HPA 1R.

Note that, in a case of a failure in some other HPA, the connection is made to the standby HPA 1R via the corresponding bypass connection line.

For example, in a case of a failure in the third-stage HPA, the third-stage switch and the fourth-stage switch from the top on the input end side take the connection forms of FIG. 2(*c*) and FIG. 2(*d*), respectively, and the active channel 2 is connected to the input end of the standby HPA 1R via the third-stage switch, the connection line 24, the fourth-stage switch, the connection line 21, and the first-stage switch. Similarly, the third-stage switch and the fourth-stage switch from the top on the output end side take the connection forms of FIG. 2(*d*) and FIG. 2(*c*), respectively, and the active channel 2*b* is connected to the output end of the standby HPA 1R via the third-stage switch, the connection line 24, the fourth-stage switch, the connection line 21, and the first-stage switch.

Similarly, in a case of a failure in the fourth-stage HPA, the switches 52 are changed over so that the active channels 3 and 3*b* on the input end side and the output end side are connected to the input end and the output end of the standby HPA 1R, respectively, via the fifth-stage switch, the connection line 24, the fourth-stage switch, the connection line 21, and the first-stage switch.

Similarly, in a case of a failure in the fifth-stage HPA, the switches 52 are changed over so that the active channels 4 and 4*b* on the input end side and the output end side are connected to the input end and the output end of the standby HPA 1R, respectively, via the sixth-stage switch, the connection line 24, the seventh-stage switch, the connection line 22, the fourth-stage switch, the connection line 21, and the first-stage switch.

[Connection of Multiple Stages of Basic Units 60 Each Having a Group of Five HPAs]

Configuration examples of the power amplification device for the satellite communication device in which multiple stages of the basic units 60 are connected in cascade to form a redundant ring are described. The examples include a case where an even number of stages are connected and a case where an odd number of stages are connected.

(1) Even-Stage Connection Configuration 61 of Basic Units 60

A configuration in which four stages of basic units each having a group of five HPAs are connected so that a total of 20 HPAs including standby HPAs are connected with respect to 16 active HPAs is conceived. In this case, the ratio of the number of the standby HPAs and the total number of the HPAs is 4:20, and the proportion of the standby HPAs is 0.2.

FIG. 3 is a diagram illustrating an even-stage connection configuration 61 of the power amplification device for the satellite communication device according to the present invention, in which four stages of the basic units 60 of FIG. 2 are connected in cascade. In FIG. 3, between adjacent two basic units that are vertically connected (connected in cascade) on each of the input side and the output side, terminals of the bottom switch of the upper basic unit and the top switch of the lower basic unit (the port 32 of the bottom switch and the port 34 of the top switch) are connected to each other via the connection line 24. In other words, the input sides and the output sides are each sequentially connected in series so that the HPAs connected between the input sides and the output sides may be arranged in parallel.

Further, the dummy terminal of the bottom switch of each of the basic units is removed, and the terminal and a similar terminal of another basic unit are connected by a bypass connection line 25.

When the even stages of the basic units 60 are connected, there are an even number of connection terminals on each of the input side and the output side, and hence the connection terminals are connected with no terminal left.

Next, an operation of the even-stage connection configuration 61 is described.

<Operation in the Case of Failures in Four Consecutive HPAs>

Figure 4:
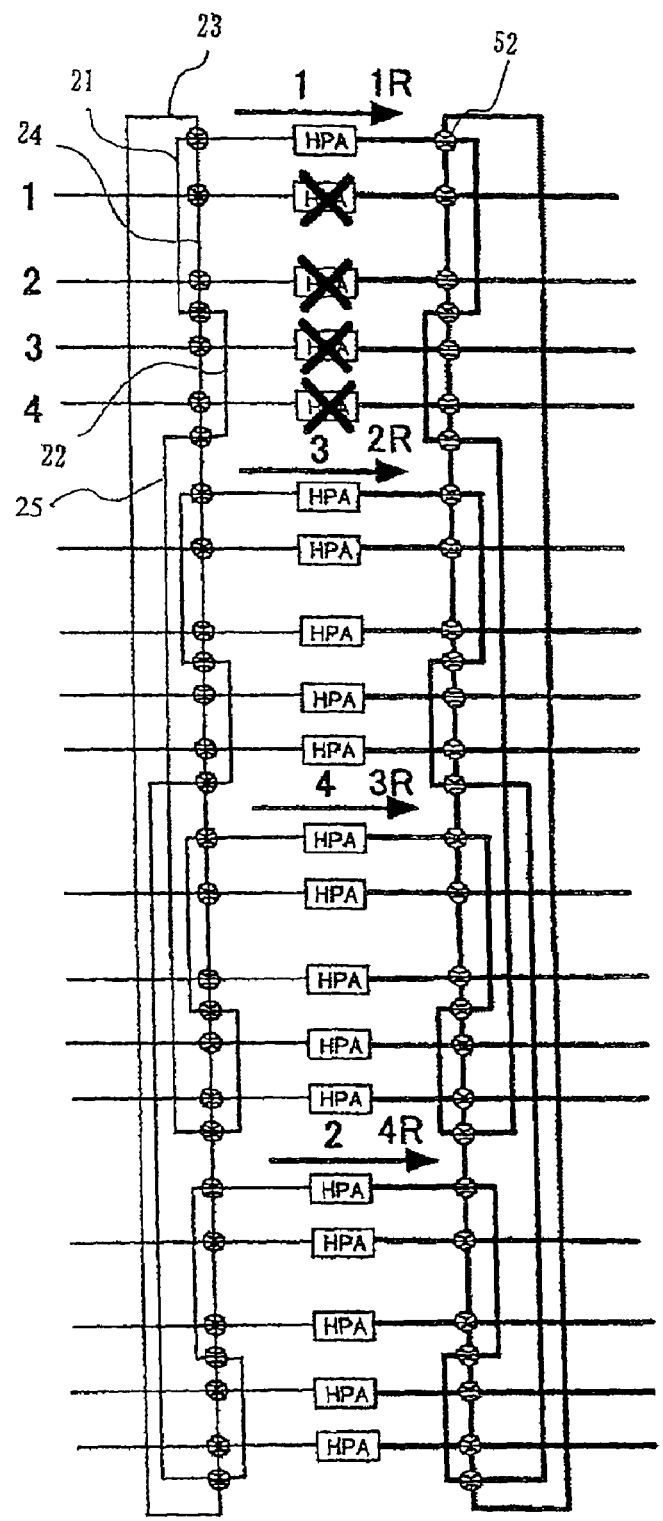
FIG. 4 A diagram illustrating an example in which failures occur in some consecutive power amplifiers in the even-stage connection configuration illustrated in FIG. 3.

FIG. 4 is a diagram illustrating an operation in a case of failures in four consecutive HPAs. FIG. 5 illustrates standby HPAs to be switched to when a failure occurs in active HPAs (HPA channels). More specifically, FIG. 5 illustrates 1st redundant positions (initial redundant connection positions), and home positions to be selected when failures occur in four consecutive HPAs in a group. In the description below, HPA channel numbers are used as reference numerals for identifying the active HPAs corresponding to the channel numbers on the left of the figures.

As illustrated in FIG. 4, when failures occur in four consecutive active HPAs (HPA channels 1 to 4 located in second, third, fifth, and sixth stages from the top) of the top-stage basic unit (top-stage block), the four faulty active HPAs may be switched to standby HPAs 1R, 4R, 2R, and 3R, respectively, at the top of each block without affecting the other operating channels. Herein, each of the standby HPAs selected on this occasion is referred to as the home position.

For example, as illustrated in FIG. 5, when a failure occurs in any one of the HPA channels 1 to 4, the connection is made to the standby HPA 1R as the 1st redundant position.

Further, when failures occur in four consecutive HPAs in the same group, based on the home positions of the HPAs illustrated in FIG. 5, the standby HPA 4R is connected to the faulty HPA channel 2, the standby HPA 2R is connected to the faulty HPA channel 3, and the standby HPA 3R is connected to the faulty HPA channel 4.

Accordingly, even if the failures occur in the four consecutive HPAs in the same group, the connection is sequentially made to the standby HPAs.

In FIG. 4, in the case where the failures occur in the four HPAs of the first-stage block (first block), the switches 52 are changed over so that the active channels 1 and 1b on the input end side and the output end side are connected to the input end and the output end of the standby HPA 1R, respectively, via the second-stage switch, the connection line 24, and the first-stage switch.

The active channels 2 and 2b are connected to the input end and the output end of the standby HPA 4R, respectively, via the third-stage switch of the first block, the connection line 24, the fourth-stage switch, the connection line 21, the first-stage switch, the connection line 23, the seventh-stage switch of the fourth block, the connection line 22, the fourth-stage switch, the connection line 21, and the first-stage switch.

The active channels 3 and 3b are connected to the input end and the output end of the standby HPA 2R, respectively, via the fifth-stage switch of the first block, the connection line 24, the fourth-stage switch, the connection line 22, the seventh-stage switch, the connection line 24, and the first-stage switch of the second block.

The active channels 4 and 4b are connected to the input end and the output end of the standby HPA 3R, respectively, via the sixth-stage switch of the first block, the connection line 24, the seventh-stage switch, the connection line 25, the seventh-stage switch of the third block, the connection line 22, the fourth-stage switch, the connection line 21, and the first-stage switch.

<Operation in the Case of Failures in any Four HPAs>

Figure 6:
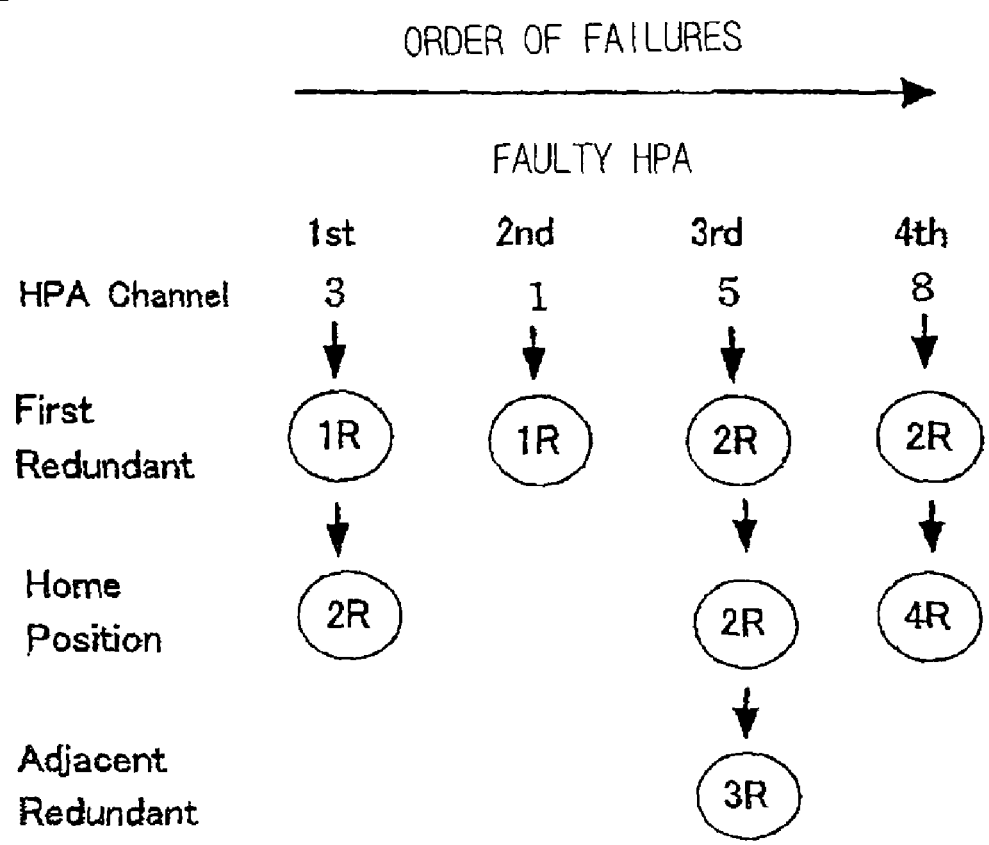
FIG. 6 A diagram illustrating a flow for selecting the standby power amplifiers when the failures occur in any four of the power amplifiers of the even-stage connection configuration of FIG. 3.

FIG. 6 is a diagram illustrating a flow for selecting the standby HPAs when failures occur in any four HPAs.

There are many cases where the failures occur in any four HPAs of 16 active HPAs, of which one case is described here but the same applies to other cases.

In FIG. 6, when a failure occurs first in the HPA channel 3, the connection is made to the 1st redundant position 1R illustrated in FIG. 5.

Then, when a failure occurs in the HPA channel 1, the HPA channel 3 is shifted to the home position 2R and the HPA channel 1 is connected to 1R, because both the 1st redundant position and the home position of the HPA channel 1 are 1R.

Then, when a failure occurs in the HPA channel 5, the HPA channel 5 is connected to an adjacent redundant position (adjacent redundant connection position) 3R because, although both the 1st redundant position and the home position of the HPA channel 5 are 2R, 2R is already occupied.

Then, when a failure occurs in the HPA channel 8, the HPA channel 8 is connected to the home position 4R because the 1st redundant position 2R is occupied, to thereby enable up to the 4th redundant connection.

(2) Odd-Stage Connection Configuration 62 of Basic Units 60

A configuration in which five stages of basic units each having a group of five HPA channels are connected so as to have a total of 25 HPAs with respect to 20 active HPAs is consumed. In this case, the ratio of the number of the standby HPAs and the total number of the HPAs is 5:25, and the proportion of the standby HPAs is 0.2.

Figure 7:
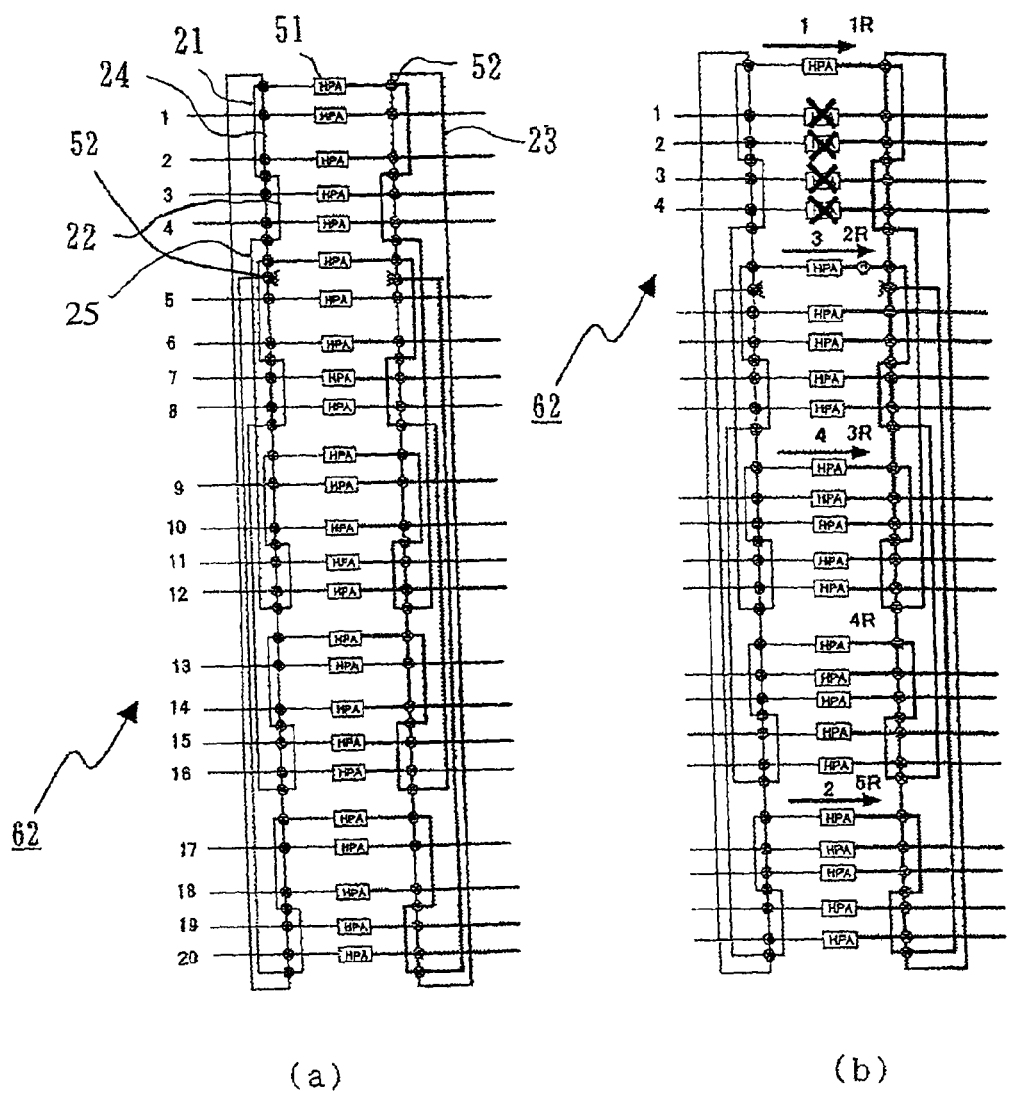
FIG. 7 Diagrams illustrating an odd-stage connection configuration according to the first embodiment of the present invention, in which an odd number of the basic units illustrated in FIG. 2 are connected in cascade.

FIG. 7 are diagrams illustrating an odd-stage connection configuration 62 of the power amplification device for the satellite communication device according to the present invention, in which five stages of the basic units 60 of FIG. 2 are connected in cascade. The basic units are connected in cascade similarly to those of FIG. 3. FIG. 7(a) illustrates the configuration, and FIG. 7(b) illustrates a case where failures occur in four consecutive HPA channels 1 to 4. The form of connection among the basic units is similar to the case where the even stages of the basic units 60 are connected. However, when an odd number of blocks are connected in cascade, there are an odd number of terminals for connection between the basic units to leave one terminal on each of the input side and the output side. In order to connect each left terminal in the ring shape, there is a need to add one switch 52 in the detour route of each of the input and output rings. In this example, the added switch corresponds to a ninth-stage switch 52 (second-stage switch of the second block) from the top of FIG. 7(a).

<Operation in the Case of Failures in Four Consecutive HPAs>

In FIG. 7(b), when failures occur in four consecutive HPAs of the top-stage block (HPA channels 1 to 4), the four faulty consecutive HPAs may be switched to the standby HPAs 1R, 4R, 2R, and 3R, respectively, without affecting the other operating channels.

FIG. 8 illustrates standby HPAs to be switched to when a failure occurs in active HPAs (HPA channels). More specifically, FIG. 8 illustrates 1st redundant positions, and home positions to be selected when failures occur in four consecutive HPAs in a group. Even if failures occur in the four consecutive HPAs in the same group, the HPA channels 1 to 20 are sequentially connected to the standby HPAs in accordance with the 1st redundant positions and the home positions of FIG. 8.

<Operation in the Case of Failures in any Four HPAs>

Figure 9:
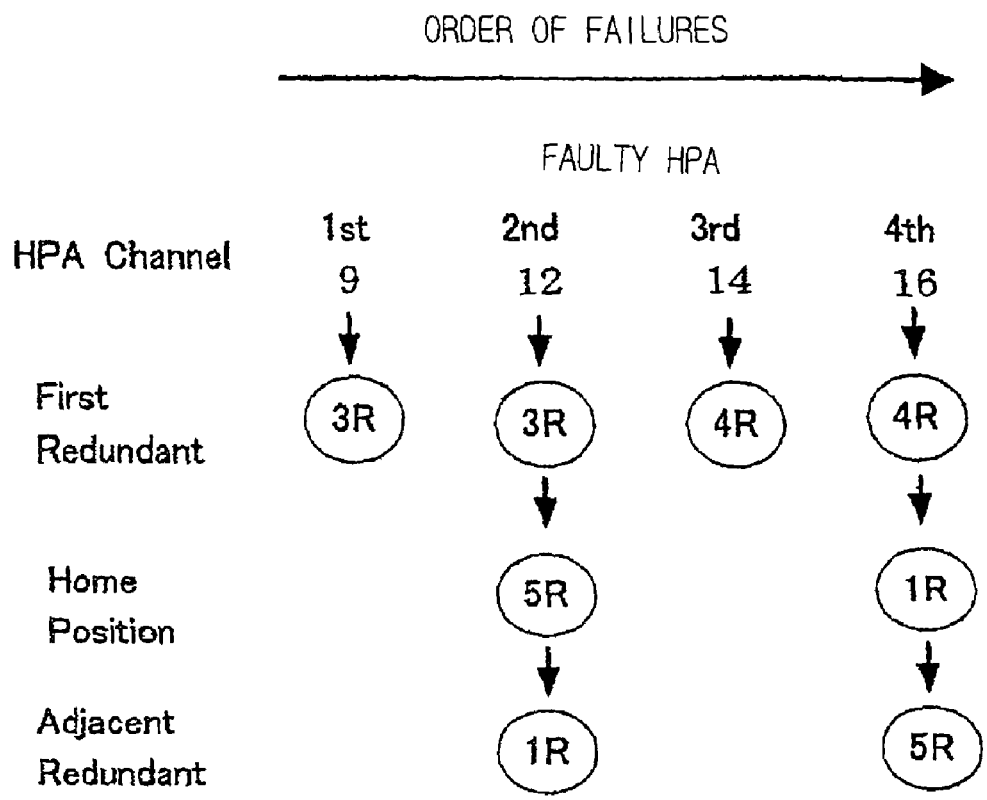
FIG. 9 A diagram illustrating a flow for selecting the standby power amplifiers when the failures occur in any four of the power amplifiers of the odd-stage connection configuration of FIG. 7.

FIG. 9 is a diagram illustrating a flow for selecting the standby HPAs when failures occur in any four HPAs. According to FIG. 9, when a failure occurs first in the HPA channel 9, the connection is made to the 1st redundant HPA 3R illustrated in FIG. 8.

Then, when a failure occurs in the HPA channel 12, the HPA channel 12 is connected to the home position 5R because the 1st redundant position 3R of the HPA channel 12 is already occupied.

Then, when a failure occurs in the HPA channel 14, the HPA channel 14 is connected to the 1st redundant position 4R.

Then, when a failure occurs in the HPA channel 16, the HPA channel 16 is connected to the home position 1R because the 1st redundant position 4R is already occupied. In this case, however, a complication arises with the detour route of the HPA channel 12 connected to 5R. Therefore, the HPA channel 12 and the HPA channel 16 are finally connected to 1R and 5R, respectively, to thereby enable up to the 4th redundant connection.

Next, a redundant configuration that supports failures in five HPAs in a ring is described.

A configuration is described below in which a redundant configuration of HPAs of the power amplification device for the satellite communication device is formed by a ring-shaped connection structure on each of the input side and output side, channels may be maintained for failures in any five HPAs in the ring (including failures in five consecutive HPAs), and further, the first failure does not block the other operating channels.

[Basic Unit 63 Having a Group of Four HPAs]

Figure 10:
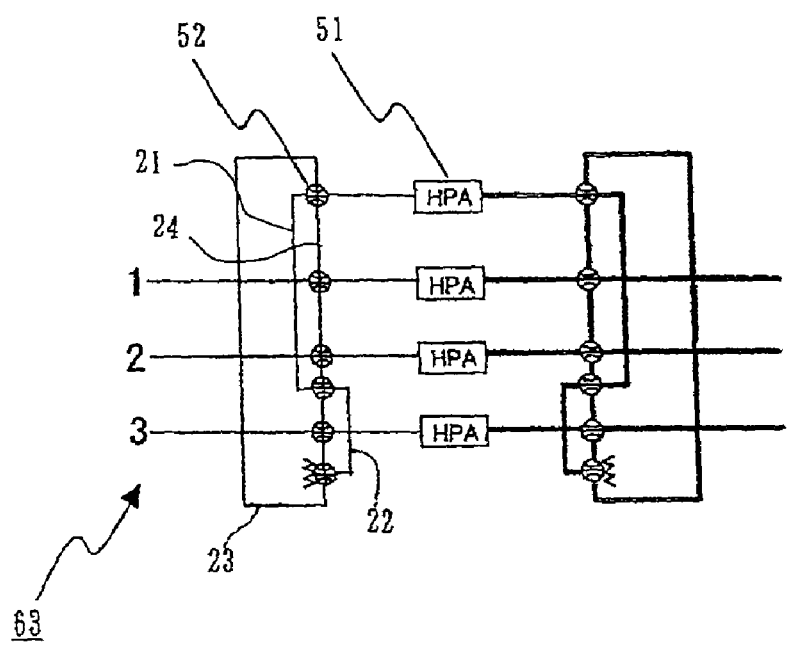
FIG. 10 A diagram illustrating an example of the basic unit of the power amplification device according to the first embodiment of the present invention, in which four power amplifiers including one standby power amplifier constitute one group.

FIG. 10 is a diagram illustrating an example of a basic unit 63 of the power amplification device, in which four HPAs including one standby HPA constitute one group. The basic unit 63 has a configuration in which, in a case of a failure in any one of the HPA channels 1 to 3 of the channels 1 to 3, the connection is made to the standby HPA in the group without affecting the other operating channels, to thereby satisfy the 1st redundancy.

Note that, the connection form of the bypass connection lines is similar to FIG. 2, except for a reduction in the total number of HPAs.

[Connection of Multiple Stages of Basic Units Each Having a Group of Four HPAs]

The redundant ring configuration is accomplished by connecting multiple stages of the basic units 63 in cascade. In this case, there are two cases of connecting an even number of stages and connecting an odd number of stages.

(1) Even-Stage Connection Configuration 64 of Basic Units 63

First, an even-stage connection configuration 64 in which six stages of the basic units 63 each having a group of four HPAs are connected so that a total of 24 HPAs including standby HPAs are connected with respect to 18 active HPAs is conceived. In this case, the ratio of the number of the standby HPAs and the total number of the HPAs is 6:24, and the proportion of standby HPAs is 0.25.

Figure 11:
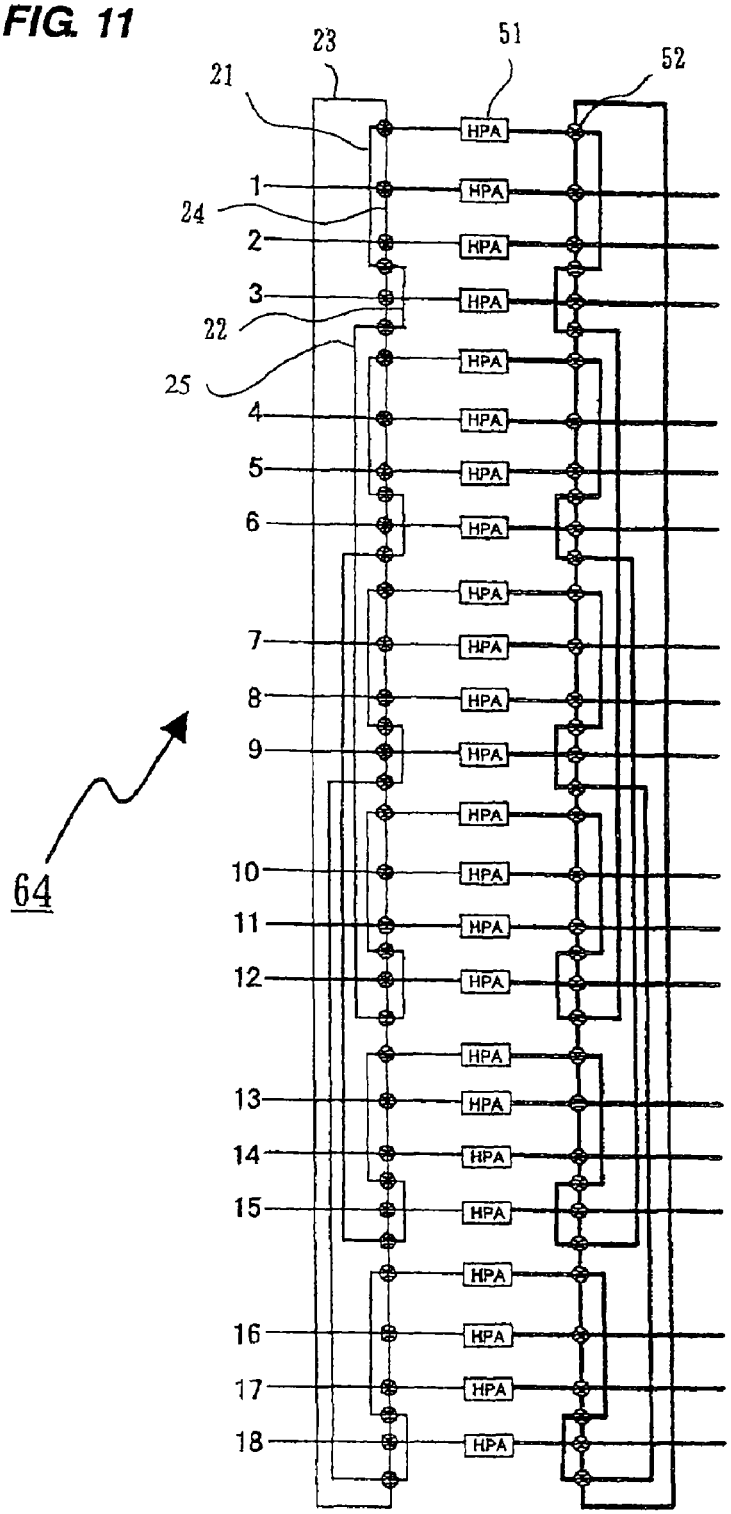
FIG. 11 A diagram illustrating an even-stage connection configuration according to the first embodiment of the present invention, in which an even number of the basic units illustrated in FIG. 10 are connected in cascade.

FIG. 11 is a diagram illustrating the even-stage connection configuration 64 of the power amplification device for the satellite communication device according to the present invention, in which the six stages of the basic units 63 illustrated in FIG. 10 are connected in cascade. The connection among the basic units, which are connected in cascade, is basically the same as the even-stage connection configuration 61 of FIG. 3.

In this configuration, further, the connection of five faulty HPAs (including five consecutive HPAs) in the ring may each be switched to the standby HPA.

(2) Odd-Stage Connection Configuration 65 of Basic Units 63

Next, an odd-stage connection configuration 65 in which five stages of the basic units 63 each having a group of four HPAs are connected so that a total of 20 HPAs including five standby HPAs are connected with respect to 15 active HPAs is conceived. In this case, the ratio of the number of the standby HPAs and the total number of the HPAs is 5:20, and the proportion of the standby HPAs is 0.25.

Figure 12:
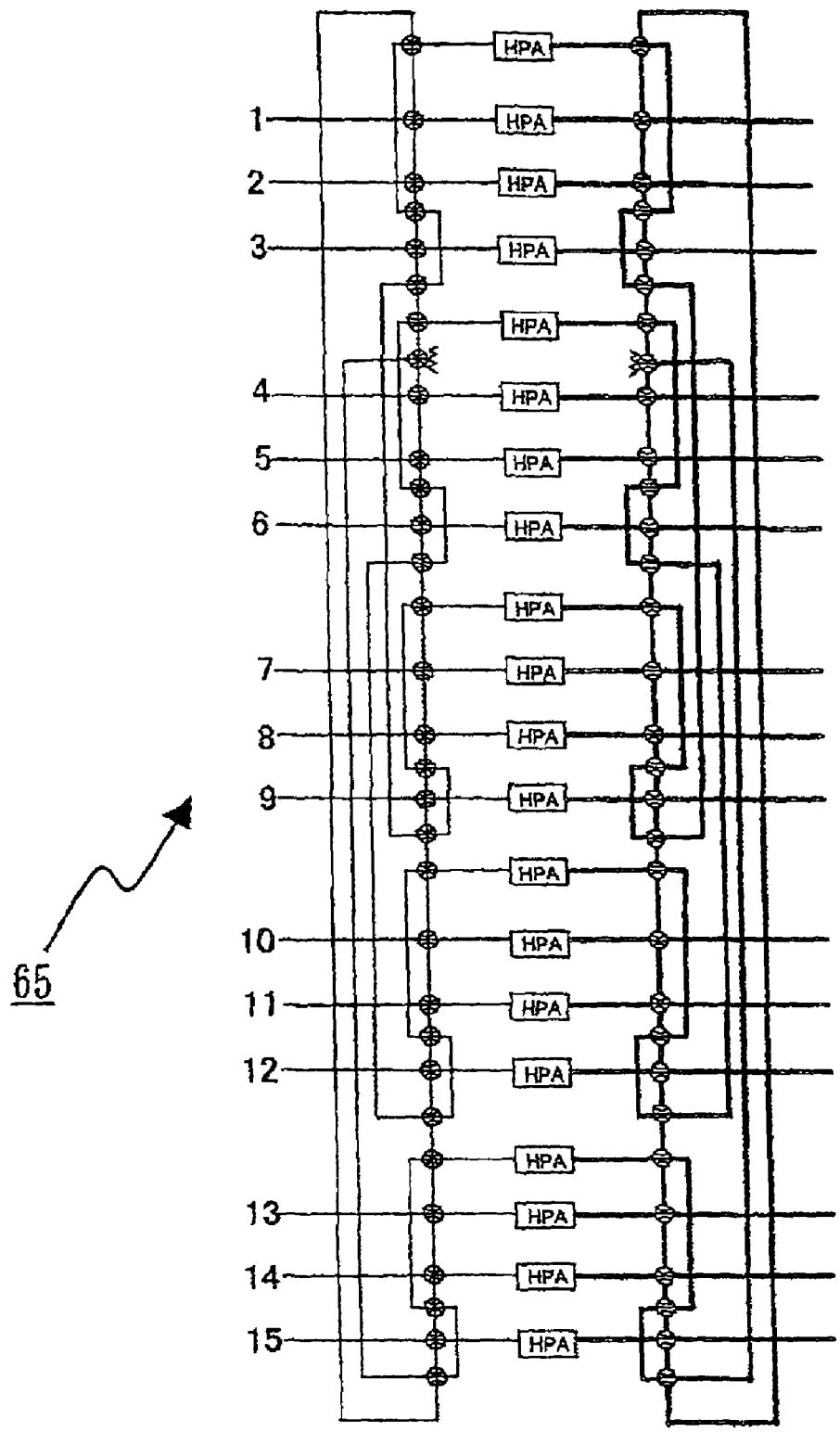
FIG. 12 A diagram illustrating an odd-stage connection configuration according to the first embodiment of the present invention, in which an odd number of the basic units illustrated in FIG. 10 are connected in cascade.

FIG. 12 is a diagram illustrating the odd-stage connection configuration 65 of the power amplification device for the satellite communication device according to the present invention, in which five stages of the basic units 63 illustrated in FIG. 10 are connected in cascade. The connection among the basic units, which are vertically connected, is basically the same as the odd-stage connection configuration 62 of FIG. 7.

In this configuration, further, five faulty HPAs in the ring (including five consecutive faulty HPAs) may be switched to the standby HPAs, respectively.

As described above, the power amplification device for the satellite communication device according to the first embodiment includes the basic units each including a plurality of the HPAs 51 including one standby HPA, which are arranged in parallel, a plurality of the switches 52 provided to the input ends and the output ends of the HPAs 51 for switching the connection paths, and the bypass connection lines 21 to 25 for connecting the switches in a ring shape, in which the plurality of basic units are connected in cascade so that the bypass connection lines connect different basic units with each other.

Further, the switches 52 are provided in number that is at least one more than the HPAs 51, and the bypass connection lines include the connection line 24 which connects the adjacent switches, the connection lines 21 and 22 which form a U shape or an S shape outside the connection line 24 and connect separated switches by bypassing one or two switches existing therebetween, the connection line 25 which connects switches belonging to different basic units outside the connection lines 21 and 22, and the connection line 23 which connects the switches at both ends of the entire device outside the connection line 25. The connection lines 21 and 22 and the connection lines 23 and 25 form multiple loops. In this case, the connection line 23 is connected so as to connect different basic units.

Note that, the bypass connection lines 21 to 25 connect the standby HPA connecting switches provided for connecting to the standby HPA. In the basic unit 60 of FIG. 2(a), the standby HPA connecting switches correspond to the first-stage switch connected to the standby HPA 1R and the fourth-stage and seventh-stage switches which are not connected to the HPAs. The standby HPA connecting switches are provided at both ends and for every second or third active HPA connecting switches in each basic unit.

Further, in the even-stage connection configuration having 2n stages, the k-th-stage basic unit and the (n+k)-th-stage basic unit are connected to each other via the connection line 25. Even in the odd-stage connection configuration having (2n+1) stages, the k-th-stage basic unit and the (n+k)-th-stage basic unit are connected to each other via the connection line 25. The (2n+1)-th-stage basic unit is connected to a desired basic unit (note that, in the above, n is a positive integer, and k=1, 2, . . . n).

For example, a redundant system of HPAs is formed so that one basic unit has five HPAs including one standby HPA, and four or more stages of the basic unit are connected in cascade. In this manner, four faulty HPAs (including consecutive faulty HPAs) in the ring may each be switched to the standby HPA.

Further, by forming one basic unit of four HPAs including one standby HPA, and connecting five or more stages of the basic units in cascade, five faulty HPAs including consecutive HPAs in the ring may each be switched to the standby HPA.

Further, by connecting the basic units in which the switches are connected in the ring configuration in cascade, one detour route is added in each of the input and output rings when two-stage configuration is provided, and the number of the detour routes increases in proportion to the number of stages so that two routes are added when four stages are provided, and three routes are added when the six stages are provided. Therefore, even when failures occur in consecutive HPAs, the closure of the detour route may be prevented.

Further, designing may be easily performed because the detour route is automatically formed by merely connecting the basic units without paying attention to the detour route during designing.

Note that, the basic unit preferably includes one standby HPA and a plurality of active HPAs. However, it should be understood that, if there is room for installing more standby HPAs, the basic unit may include a plurality of standby HPAs and a plurality of active HPAs.

Second Embodiment

In the first embodiment, the power amplification device for the satellite communication device is described, in which, using the basic units 60 or 63, in a case where one standby HPA is provided with respect to four active HPAs, up to four faulty HPAs in the ring are all switched to the standby HPAs, and in a case where one standby HPA is provided with respect to three active HPA, up to five faulty HPAs in the ring are all switched to the standby HPA.

With this structure, when the basic units are connected and arranged in cascade, in the case of odd-stage arrangement, one terminal for connection is left. The one terminal left is connected to the bypass connection line constituting the ring by a switch, and the end thereof is connected to the dummy terminal. In this case, it is assumed that the number of the active channels (=the number of the active HPAs) may be divisible by the number of the active channels (=the number of the active HPAs) of the basic unit.

For example, in a case where four stages of the basic units 60 each having a group of five HPAs are connected in cascade, and the power amplification device including a total of 20 HPAs including four standby HPAs with respect to 16 active channels is formed, 16, which is the number of the active channels, is divisible by four, which is the number of the active channels in a group.

As described above, in all the cases in the first embodiment, there is a condition that the total number of the active channels is divisible by the number of the active channels of a basic unit.

However, in a case where the total number of the channels is an arbitrary number of active channels, which is indivisible by the number of the channels in a basic unit, the connection form is different from that described above. In a second embodiment, a power amplification device for a satellite communication device including the arbitrary number of the active channels with a condition that the total number of the channels is indivisible by the number of the channels in a basic unit is described.

Hereinafter, the power amplification device according to the second embodiment is described.

[Basic Unit Having a Group of Five HPAs]

Figure 13:
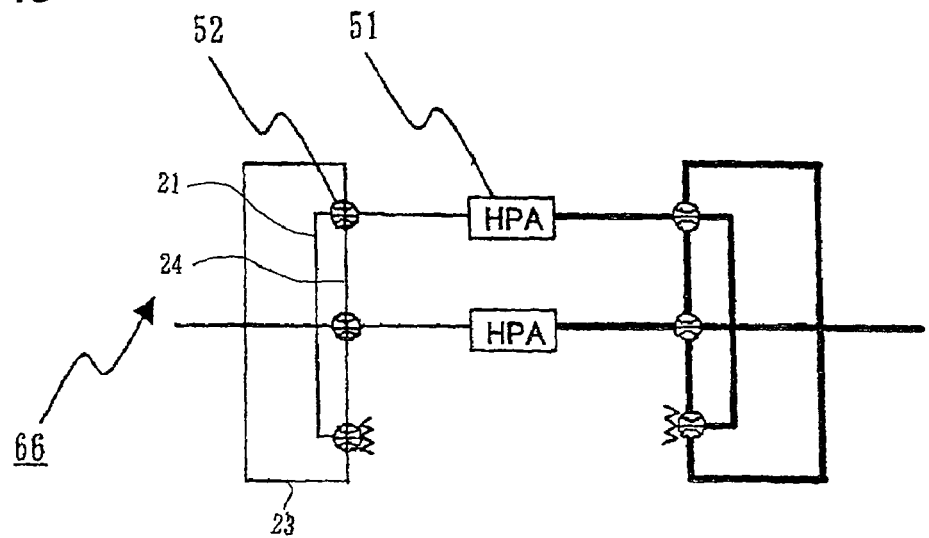
FIG. 13 A diagram illustrating an example of a basic unit of a power amplification device according to a second embodiment of the present invention, in which two power amplifiers including one standby power amplifier constitute one group.
Figure 14:
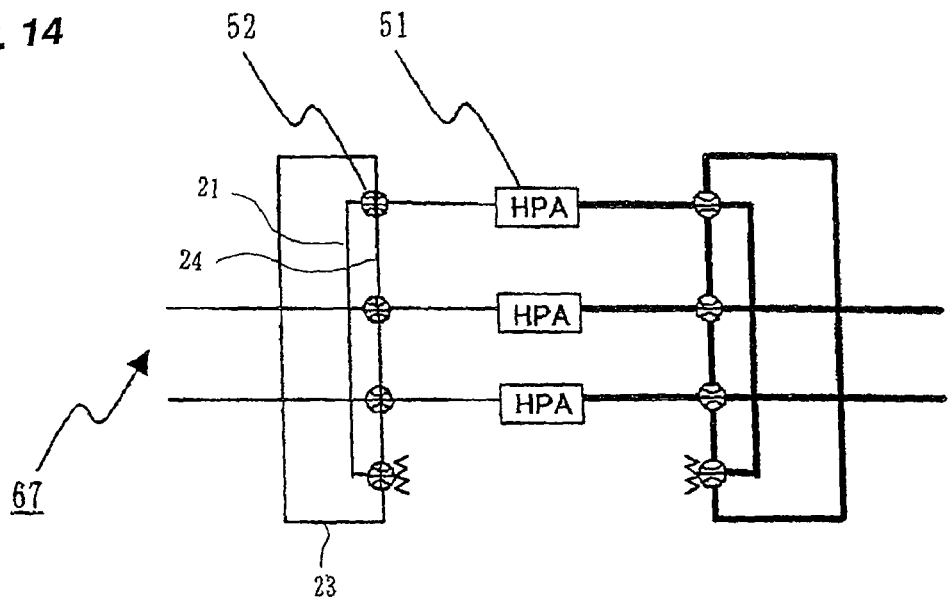
FIG. 14 A diagram illustrating an example of the basic unit of the power amplification device according to the second embodiment of the present invention, in which three power amplifiers including one standby power amplifier constitute one group.

FIG. 13 illustrates a basic unit 66 (a group of two HPAs) of the power amplification device according to this embodiment, and FIG. 14 illustrates a basic unit 67 (a group of three HPAs) of the power amplification device according to this embodiment. In this embodiment, using a redundant system even-stage connection configuration as illustrated in FIG. 3, in which four stages of the basic units 60 each having a group of five HPAs are connected in cascade so that a total of 20 HPAs are connected with respect to 16 active channels, as a base, the basic unit 66 or 67 illustrated in FIG. 13 or FIG. 14, or the basic unit 63 (a group of four HPAs) illustrated in FIG. 10 is added. In this manner, the redundant system power amplification device for the satellite communication device that supports the arbitrary number of the channels is formed.

For example, in a case where the number of the active channels is 17, the basic unit 66 including two HPAs (one standby HPA and one active HPA) of FIG. 13 is added to the redundant system even-stage connection configuration including 16 active HPAs, in which four stages of the basic units 60 are connected in cascade. At this time, the total number of the HPAs is 22.

Further, in a case where the number of the active channels is 18, the basic unit 67 including three HPAs (one standby HPA and two active HPAs) of FIG. 14 is added to the redundant system even-stage connection configuration including 16 active HPAs, in which four stages of the basic units 60 are connected in cascade. At this time, the total number of the HPAs is 23.

Further, in a case where the number of the active channels is 19, the basic unit 63 including four HPAs (one standby HPA and three active HPAs) of FIG. 10 is added to the redundant system even-stage connection configuration including 16 active HPAs, in which four stages of the basic units 60 are connected in cascade. At this time, the total number of the HPAs is 24.

In a case where the total number of the basic units including the added basic unit is an odd number, one terminal for connection is left. The one terminal left is connected to the ring-shaped bypass connection line by a switch, and the end thereof is connected to the dummy terminal.

Note that, in a case where the number of the active channels is 20, five stages of the basic units 60 each having a group of five HPAs are connected. This corresponds to the case where the redundant system is formed of a total of 25 HPAs with respect to 20 active HPAs, as described in FIG. 7.

[Basic Unit Having a Group of Four HPAs]

In this embodiment, using a redundant system odd-stage connection configuration as illustrated in FIG. 12, in which five stages of the basic units 63 each having a group of four HPAs are connected so that a total of 20 HPAs are connected with respect to 15 active channels, as a base, the basic unit 66 or 67 illustrated in FIG. 13 or FIG. 14, or the basic unit 63 (a group of four HPAs) of the HPAs illustrated in FIG. 10 is added. In this manner, the satellite communication device that supports the arbitrary number of the channels is formed.

For example, in a case where the number of the active channels is 16, the basic unit 66 including two HPAs (one standby HPA and one active HPA) of FIG. 13 is added to the redundant system odd-stage connection configuration including 15 active HPAs, in which five stages of the basic units 63 are connected in cascade. At this time, the total number of the HPAs is 22.

Further, in a case where the number of the active channels is 17, the basic unit 67 including three HPAs (one standby HPA and two active HPAs) of FIG. 14 is added to the redundant system odd-stage connection configuration including 15 active HPAs, in which five stages of the basic units 63 are connected in cascade. At this time, the total number of the HPAs is 23.

Note that, in a case where the number of the active channels is 18, the configuration is the same as that of the even-stage connection configuration 64 described in FIG. 11, and six stages of the basic units 63 each having a group of four HPAs illustrated in FIG. 10 are connected in cascade, which corresponds to a case of a configuration in which a total of 24 HPAs is connected with respect to 18 active HPAs.

Further, in a case where the total number of the basic units including the added basic unit is an odd number, the configuration is same as that described above.

Note that, it should be understood that the present invention includes any possible combinations of the embodiments described above.

INDUSTRIAL APPLICABILITY

The power amplification device for the satellite communication device according to the present invention is applicable not only to the satellite communication device but also in a large number of fields.

The invention claimed is:

1. A power amplification device for a satellite communication device, comprising a plurality of basic units each including:
   a plurality of power amplifiers arranged in parallel between respective paired input and output lines and including at least one standby power amplifier;
   a plurality of switches provided to connect respective input and out lines of the basic unit to respective input ends and output ends of the plurality of power amplifiers for switching connection paths; and
   a bypass connection line comprising plural individual lines configured to connect the plurality of switches in a ring-shaped detour route and to connect the plurality of basic units in cascade, said ring-shaped detour route configurable by operation of said switches to connect, through said switches and said bypass connection line, the input and output ends of the standby power amplifier to any of said paired input and output lines, thereby to bypass a power amplifier and replace the bypassed power amplifier with said standby power supply in dependence on settings of said plurality of switches.

2. The power amplification device for a satellite communication device according to claim 1, wherein:
   the plurality of switches are provided in number that is at least one more than the plurality of power amplifiers for the input ends and the output ends, respectively;
   the bypass connection line comprises a first line connecting adjacent ones of the plurality of switches, a second line connecting separate ones of the plurality of switches that are at least one switch apart outside the first line, and a third line connecting ones of the plurality of switches belonging to different ones of the plurality of basic units outside the second line; and
   the second line and the third line form multiple loops.

3. The power amplification device for a satellite communication device according to claim 1, wherein each of the plurality of basic units includes four active power amplifiers and one standby power amplifier.

4. The power amplification device for a satellite communication device according to claim 1, wherein each of the plurality of basic units includes three active power amplifiers and one standby power amplifier.

5. The power amplification device for a satellite communication device according to claim 1, wherein the plurality of basic units comprise a first basic unit including four active power amplifiers and one standby power amplifier, and a second basic unit including two active power amplifiers and one standby power amplifier.

6. The power amplification device for a satellite communication device according to claim 1, wherein the plurality of basic units comprise a first basic unit including three active power amplifiers and one standby power amplifier, and a second basic unit including two active power amplifiers and one standby power amplifier.

7. The power amplification device for a satellite communication device according to claim 2, wherein each of the plurality of basic units includes four active power amplifiers and one standby power amplifier.

8. The power amplification device for a satellite communication device according to claim 2, wherein each of the plurality of basic units includes three active power amplifiers and one standby power amplifier.

9. The power amplification device for a satellite communication device according to claim 2, wherein the plurality of basic units comprise a first basic unit including four active power amplifiers and one standby power amplifier, and a second basic unit including two active power amplifiers and one standby power amplifier.

10. The power amplification device for a satellite communication device according to claim 2, wherein the plurality of basic units comprise a first basic unit including three active power amplifiers and one standby power amplifier, and a second basic unit including two active power amplifiers and one standby power amplifier.

11. The power amplification device for a satellite communication device according to claim 1, wherein said switches each include plural output ports and plural selectable connection members defining connection paths between selected pairs of output ports, each connection path when selected defining a different signal routing path through the respective switch.

12. The power amplification device for a satellite communication device according to claim 11, wherein said switches each include a circular rotating part defining a circumference and having said output ports provided on the circumference.

13. The power amplification device for a satellite communication device according to claim 12, wherein said output ports are provided on the circumference of said circular rotating part every 90 degrees of rotation of said circular rotating part.

14. The power amplification device for a satellite communication device according to claim 2, wherein said switches each include plural output ports and plural selectable connection members defining connection paths between selected pairs of output ports, each connection path when selected defining a different signal routing path through the respective switch.

15. The power amplification device for a satellite communication device according to claim 14, wherein said switches each include a circular rotating part defining a circumference and having said output ports provided on the circumference.

16. The power amplification device for a satellite communication device according to claim 15, wherein said output ports are provided on the circumference of said circular rotating part every 90 degrees of rotation of said circular rotating part.

* * * * *